United States Patent
Yamagata et al.

(10) Patent No.: US 7,619,547 B2
(45) Date of Patent: Nov. 17, 2009

(54) SERIAL-TO-PARALLEL CONVERTER CIRCUIT AND LIQUID CRYSTAL DISPLAY DRIVING CIRCUIT

(75) Inventors: Yoshiyuki Yamagata, Gunma-ken (JP);
Tetsuya Tokunaga, Gunma-ken (JP);
Yasuo Osawa, Gunma-ken (JP);
Kensuke Goto, Ashikaga (JP)

(73) Assignees: Sanyo Electric Co., Ltd., Osaka (JP);
Sanyo Semiconductor Co., Ltd., Gunma (JP)

( * ) Notice: Subject to any disclaimer, the term of this patent is extended or adjusted under 35 U.S.C. 154(b) by 63 days.

(21) Appl. No.: 12/044,867

(22) Filed: Mar. 7, 2008

(65) Prior Publication Data
US 2008/0218389 A1      Sep. 11, 2008

(30) Foreign Application Priority Data
Mar. 8, 2007 (JP) .............................. 2007-058961

(51) Int. Cl.
*H03M 9/00* (2006.01)
(52) U.S. Cl. ................. 341/100; 341/101; 375/340; 375/354; 375/371; 375/372
(58) Field of Classification Search .......... 341/100.101; 375/340, 354
See application file for complete search history.

(56) References Cited

U.S. PATENT DOCUMENTS

| | | | | |
|---|---|---|---|---|
| 3,946,379 A | * | 3/1976 | Lippman | .................... 341/100 |
| 5,040,195 A | * | 8/1991 | Kosaka et al. | ................ 375/365 |
| 5,155,487 A | * | 10/1992 | Tanaka et al. | ................ 341/100 |
| 5,760,707 A | * | 6/1998 | Katagiri | .................. 340/870.11 |
| 5,926,120 A | * | 7/1999 | Swenson et al. | ............ 341/100 |
| 6,052,073 A | * | 4/2000 | Carr et al. | ..................... 341/100 |
| 6,150,965 A | * | 11/2000 | Carr et al. | ..................... 341/101 |
| 6,198,415 B1 | * | 3/2001 | Yoshikawa et al. | .......... 341/100 |
| 6,628,214 B1 | * | 9/2003 | Kawase et al. | ............... 341/100 |
| 6,732,205 B2 | * | 5/2004 | Kamihara et al. | ............. 710/71 |
| 6,768,431 B2 | * | 7/2004 | Chiang | ........................ 341/100 |
| 7,310,057 B2 | * | 12/2007 | Murata et al. | ................ 341/101 |

FOREIGN PATENT DOCUMENTS

JP      2003-218705     7/2003

* cited by examiner

*Primary Examiner*—Linh V Nguyen
(74) *Attorney, Agent, or Firm*—SoCal IP Law Group LLP; Steven C. Sereboff; John E. Gunther

(57) ABSTRACT

A serial-to-parallel converter circuit comprising: an m-bit serial data holding unit to be input with serial data whose input bit number is set to m or n (<m) bits within a transfer period and a serial clock synchronized therewith, and to shift and hold the serial data by one bit based on the serial clock; an input mode identifying unit to identify whether the input bit number is m or n bits, based on a count value obtained by counting the number of generation of the serial clock during the transfer period; and a parallel data generating unit to output the held m-bit data as first parallel data when the input bit number is identified as m bits, and to output m-bit data obtained by adding predetermined (m−n)-bit data to the held n-bit data as second parallel data when the input bit number is identified as n bits.

8 Claims, 8 Drawing Sheets

SERIAL-TO-PARALLEL CONVERTER CIRCUIT AND LIQUID CRYSTAL DISPLAY DRIVING CIRCUIT

CROSS-REFERENCE TO RELATED APPLICATION

This application claims the benefit of priority to Japanese Patent Application No. 2007-058961, filed Mar. 8, 2007, of which full contents are incorporated herein by reference.

BACKGROUND OF THE INVENTION

1. Field of the Invention

The present invention relates to a serial-to-parallel converter circuit and a liquid crystal display driving circuit.

2. Description of the Related Art

Recently, there has been mainly adopted a serial interface transferring serial data, as a data transfer system between a device at transmitting-side and a device at receiving-side. The examples therefor are a three-wire serial interface (serial data DI, a serial clock CL, a chip enable CE), a four-wire serial interface (serial data SI, serial data SO, a serial clock CL, a chip enable CE), a two-wire serial interface (serial data SDA, a serial clock SCL), etc. While data format to be used for transferring data from the device at transmitting-side to the device at receiving-side is serial data, data format to be used for processing in the device at receiving-side is parallel data. Therefore, a device at receiving-side employing a serial interface is required to provide a serial-to-parallel converter circuit (see, for example, Japanese Patent Laid-Open Patent Publication No. 2003-218705).

In a system including a device at transmitting-side and a device at receiving-side, there is a case where serial data of a new number of input bits needs to be dealt with for the purpose of achieving high functionality, etc. For example, in a LCD (Liquid Crystal Display) driving system, in which a device at transmitting-side is a microcomputer and a device at receiving-side is a LCD module for driving and displaying a LCD panel, there is a case where 8-bit display data (composed of segment signal, common signal and display control data, and hereinafter referred to as 8-bit serial data) needs to be deal with, in addition to original 6-bit display data (composed of segment signal, common signal and display control data, and hereinafter referred to as 6-bit serial data), for example.

However, a serial-to-parallel converter circuit originally provided in the LCD module (device at receiving-side) is a circuit intrinsically supporting original 6-bit serial data. For instance, a serial-to-parallel converter circuit supporting 6-bit serial data is usually configured with a shift register obtained by cascade-connecting six stages of flip-flops, and is not able to support serial data of other than 6 bits. Therefore, there is simply considered such an improvement that a serial-to-parallel converter circuit supporting 8-bit serial data and a signal processing system dealing with 8-bit parallel data are newly provided in the LCD module (device at receiving-side).

However, when making such an improvement to the LCD module (device at receiving-side), various improvements are also required of a microcomputer (device at transmitting-side) accordingly. To be more specific, an easily conceivable way is providing the LCD module (device at receiving-side) with a control input terminal for identifying 6-bit serial input data or 8-bit serial input data, which is transferred from the microcomputer (device at transmitting-side). In this case, on the microcomputer side (device at transmitting-side), a software is needed to be improved so as to set a transmission format (rules for data format, procedure of transmission, etc.) of a control signal to be input to the control input terminal (signal indicating that an input signal is either a six-bit signal or an eight-bit signal), etc. Furthermore, in accordance with such an improvement of the software, there may be needed an improvement for a hardware such that a control output terminal for outputting the control signal is added, etc.

As described above, the compatibility with existing devices at transmitting-side cannot be maintained only by making an improvement to devices at receiving side, just like an addition of a signal processing system such as a serial-to-parallel converter circuit supporting serial data of a new number of input bits. The compatibility means characteristics that a plurality of elements to be combined can be substituted with each other. Therefore, an improvement becomes necessary for existing devices at transmitting-side and, thereby causing a problem that the time of system development is extended and the cost thereof increases.

SUMMARY OF THE INVENTION

A serial-to-parallel converter circuit according to an aspect of the present invention, which converts serial data into parallel data to be output, comprises: an m-bit serial data holding unit configured to be input with serial data and a serial clock synchronized with the serial data, an input bit number of the serial data being set to be m bits or n bits smaller than the m bits within a transfer period from transfer start to transfer completion, and configured to shift and hold the serial data by one bit based on the serial clock; an input mode identifying unit configured to identify whether the input bit number is m bits or n bits, based on an count value obtained by counting the number of generation of the serial clock during the transfer period; and a parallel data generating unit configured to output m-bit data held in the m-bit serial data holding unit as first parallel data when the input mode identifying unit identifies the input bit number to be m bits, and configured to output m-bit data obtained by adding predetermined (m−n)-bit data to n-bit data held in the m-bit serial data holding unit as second parallel data when the input mode identifying unit identifies the input bit number to be n bits.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

<<<Configuration of LCD Driving System>>>

Figure 1:
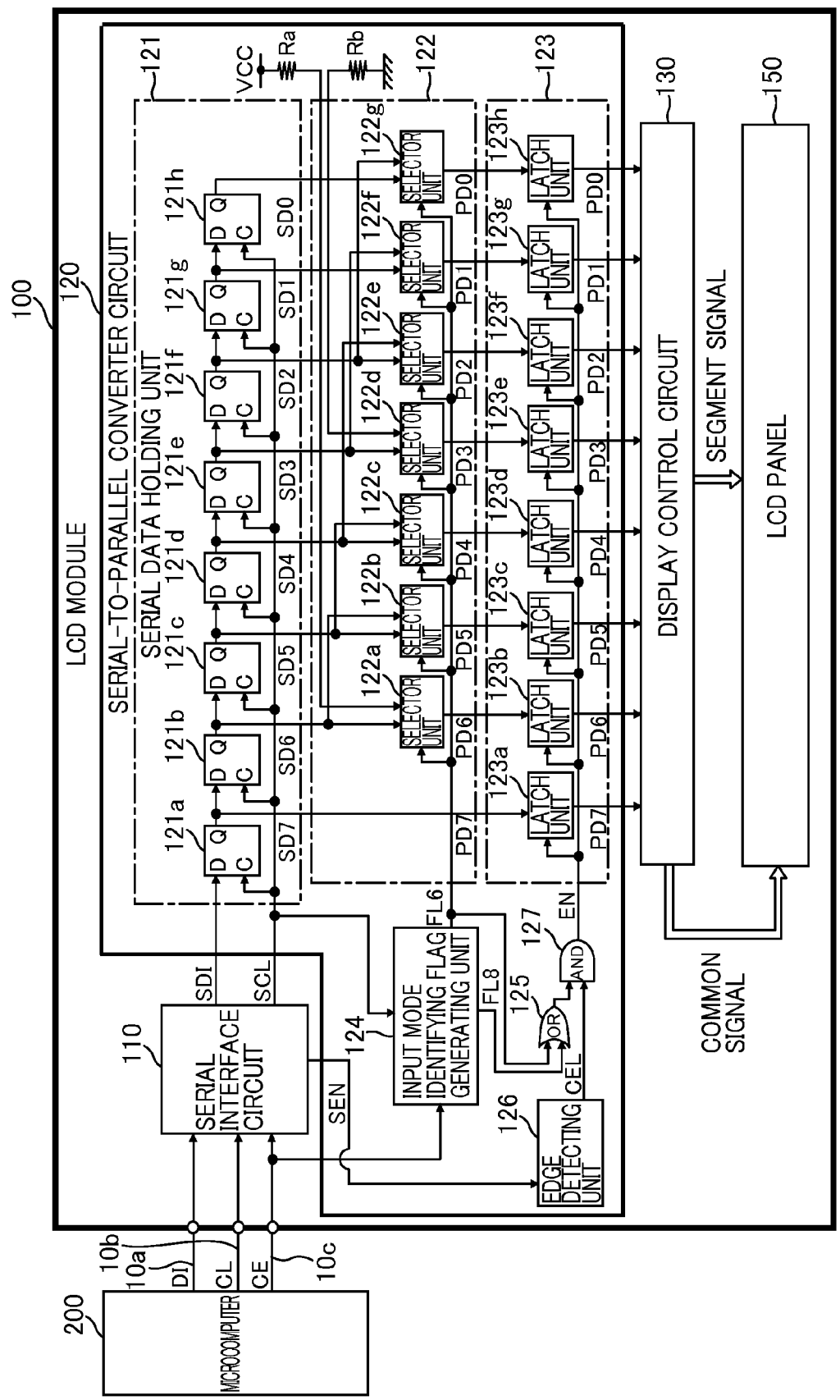
FIG. 1 is a diagram showing a configuration of an LCD drive system according to an embodiment of the present invention.

FIG. 1 is a diagram showing a configuration of an LCD driving system including a microcomputer 200 (device at transmitting-side), an LCD module 100 (device at receiving-side) having a serial-to-parallel converter circuit 120 according to an embodiment of the present invention. The "liquid crystal display driving circuit" according to an embodiment of the present invention indicates the LCD module 100 exclusive of an LCD panel 150, however, may include a segment electrode and a common electrode of the LCD panel 150.

As a data transfer system between the microcomputer 200 and the LCD module 100, a three-wire serial interface is employed. The three-wire serial interface uses a bus 10a for transferring serial data DI, a bus 10b for transferring a serial clock CL and a bus 10c for transferring a chip enable CE. To be more specific, when the chip enable CE is switched from "L" to "H", transfer begins, and when the chip enable CE is switched from "H" to "L", transfer is completed. This three-wire serial interface follows a serial transfer format (rules of transfer timing, data format, etc.) in which the serial data DI, whose input bits are set in number within the transfer period during which the chip enable CE is "H", is transferred in synchronization with the serial clock CL (see waveforms of the serial data DI, the serial clock CL and the chip enable CE shown in FIGS. 8 and 9).

The microcomputer 200 transfers, to the LCD module 100 as serial data, display data (made up of segment signal, common signal, display control data for controlling frame frequency, etc.) whose input bits are m-bits or n-bits that is smaller than m-bits by using the three-wire serial interface via three buses 10a, 10b and 10c. In the following, the description will be made assuming [(m, n)=(8, 6)] for convenience of explanation. In other words, there are two cases in which: 8-bit display data is transferred from the microcomputer 200 to the LCD module 100 (hereinafter referred to as 8-bit input mode), and 6-bit display data is transferred from the microcomputer 200 to the LCD module 100 (hereinafter referred to as 6-bit input mode).

The LCD module 100 includes a serial interface circuit 110, a serial-to-parallel converter circuit 120, a display control circuit 130, and an LCD panel 150. While the LCD module 100 originally drives the LCD panel 150 by use of 6-bit input data, degree of flexibility of display control data is enhanced in the 8-bit input mode obtained by an addition of 2-bits for controlling additional functions, due to function enhancement of the LCD module 100, thereby achieving broader options with respect to the LCD panel 150.

The serial interface circuit 110 is a circuit that the serial data DI, the serial clock CL and the chip enable CE transferred from the microcomputer 200 are input to and that outputs serial data SDI, a serial clock SCL and data SEN.

Figure 8:
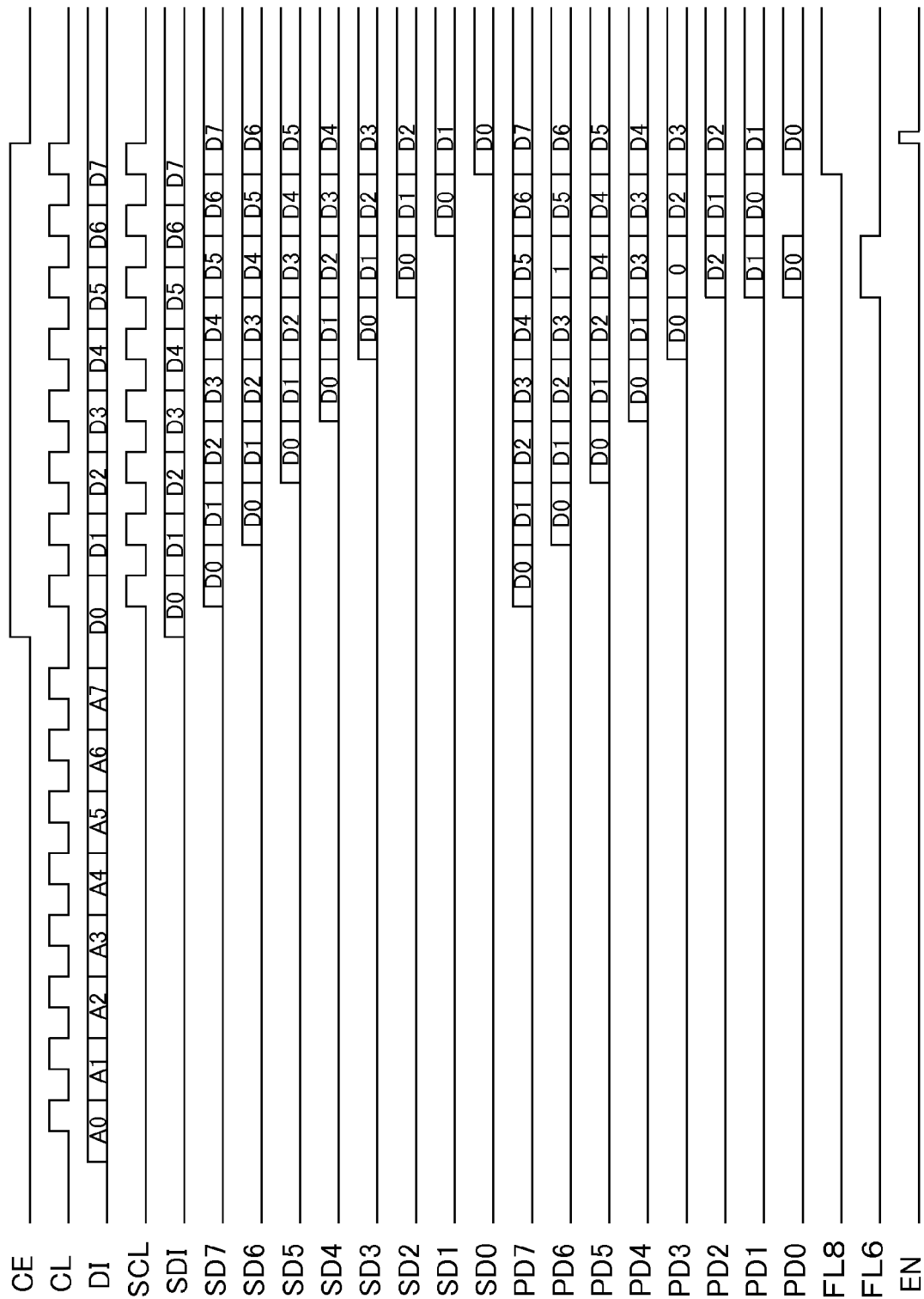
FIG. 8 is a waveform showing a main signal for explaining an operation of a serial-to-parallel converter circuit in an 8-bit input mode according to an embodiment of the present invention.
Figure 9:
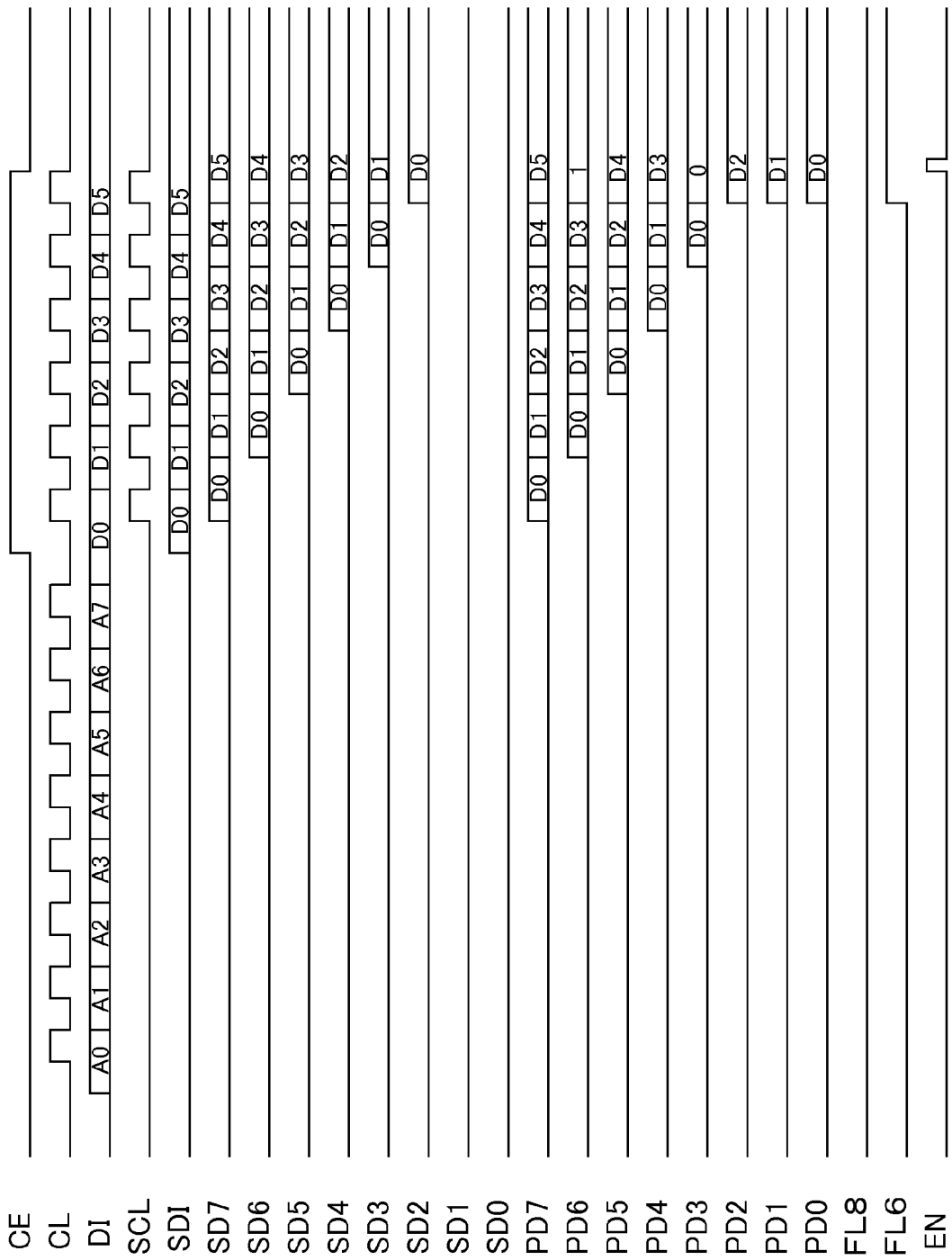
FIG. 9 is a waveform showing a main signal for explaining an operation of a serial-to-parallel converter circuit in a 6-bit input mode according to an embodiment of the present invention.

The relationship between: the serial data DI, the serial clock CL and the chip enable CE; and the serial data SDI and the serial clock SCL is as shown in FIGS. 8 and 9. The microcomputer 200 transfers, after setting the chip enable CE to be "L", 8-bit address codes A0-A7 as serial data DI in synchronization with the serial clock SCL. Then, the microcomputer 200 switches the chip enable CE from "L" to "H", thereby transferring the serial data DI following the 8-bit address codes A0-A7 (D0-D7 in the 8-bit input mode or D0-D5 in the 6-bit input mode) in synchronization with the serial clock SCL.

Figure 2:
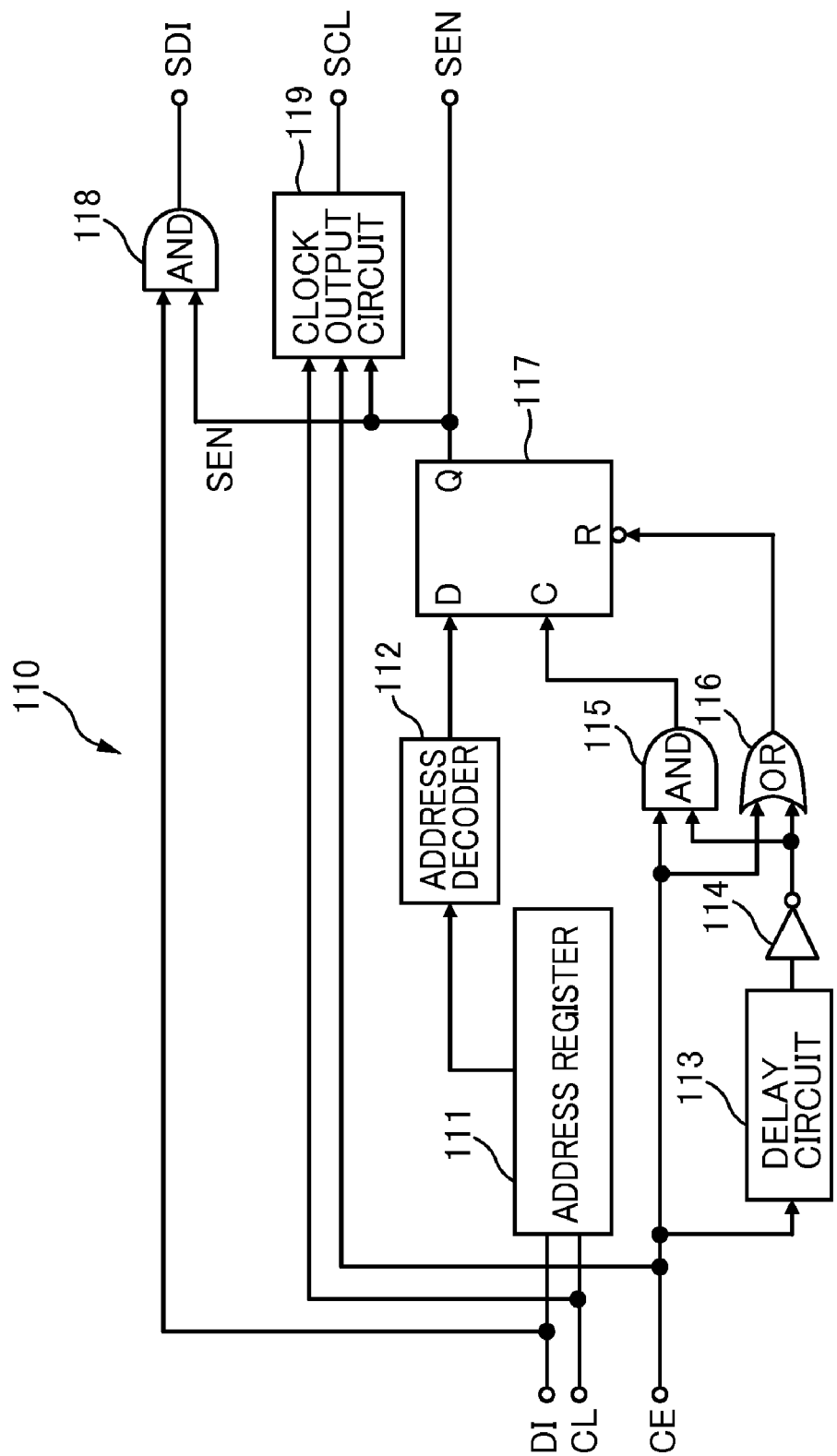
FIG. 2 is a diagram showing a configuration of a serial interface circuit according to an embodiment of the present invention.

In order to realize relationship of input and output mentioned above, the serial interface circuit 110 is embodied according to a configuration shown in FIG. 2. An address register 111 stores the serial data DI (address codes A0-A7) at a rising edge of the serial clock CL. An address decoder 112 determines whether the 8-bit address codes A0-A7 stored in the address register 111 coincide with address codes given to the LCD module 100 or not, and when having determined the 8-bit address codes A0-A7 coincide with address codes given to the LCD module 100, the address decoder 112 outputs "H". An OR element 116 outputs "L" at the falling edge of the chip enable CE and keeps outputting "L" just during a delay time of a delay circuit 113, and thereafter outputs "H". An AND element 115 outputs "H" at the rising edge of the chip enable CE and keeps outputting "H" just during a delay time of the delay circuit 113, and after that, outputs "L".

Therefore, a D flip-flop 117 is reset at the falling edge of the chip enable CE and holds a decode output of the address decoder 112 at the rising edge of the chip enable CE, and outputs the data SEN identical to this decode output. That is, the D flip-flop 117 outputs the data SEN of "H" when decoded address codes A0-A7 coincidence with address codes of the LCD module 100. The AND element 118 outputs the serial data DI (D0-D7 (in the 8-bit input mode) or D0-D5 (in the 6-bit input mode)) as serial data SDI when the data SEN is "H".

Figure 3:
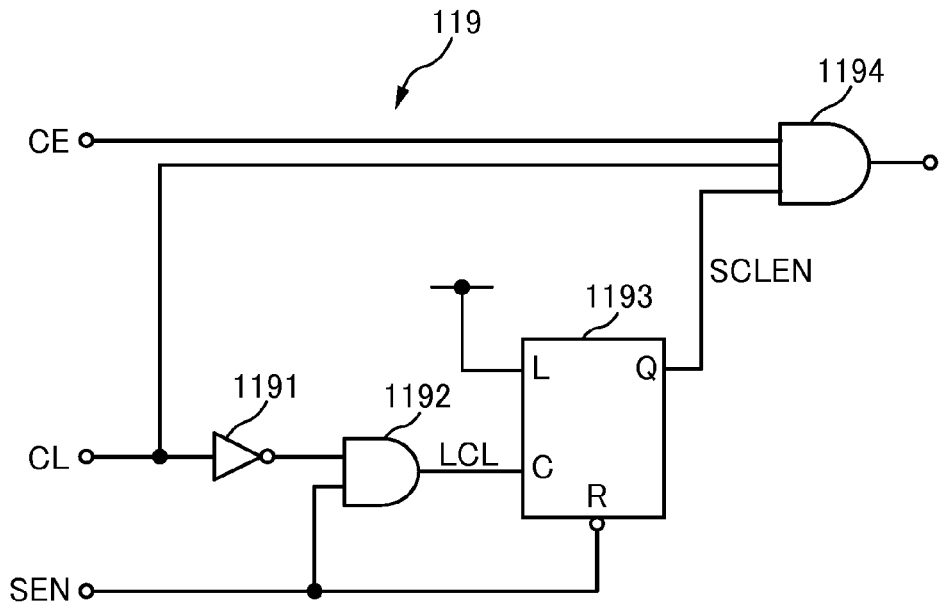
FIG. 3 is a diagram showing a configuration of a clock output circuit according to an embodiment of the present invention.

A clock output circuit 119 is embodied according to a configuration shown in FIG. 3. An AND element 1192 outputs the serial clock CL inverted by an inverter element 1191 as a latch clock LCL when the data SEN is "H". A latch circuit 1193 outputs data SCLEN of "H" at the rising edge of a latch clock LCL. An AND element 1194 outputs the serial clock CL as the serial clock SCL when the chip enable CE and the data SCLEN are "H".

As described above, the serial interface circuit 110 makes a determination as to address codes to be transferred before transfer of the serial data DI and then allows the serial data SDI and the serial clock SCL to be input to the serial-to-parallel converter circuit 120 at the subsequent stage. Such a serial interface circuit 110 is provided so that the microcomputer 200 (master) can support a multiple slave environment in which a device (slave) employing a serial interface other than the LCD module 100 (slave) is connected to the microcomputer 200.

The serial-to-parallel converter circuit 120 is a circuit that the serial data SDI and the serial clock SCL from the serial interface circuit 110 are input to and that outputs 8-bit parallel data PD0-PD7. When a serial-to-parallel conversion supporting 6-bit serial data SDI is performed, predetermined 6-bit parallel data (PD0, PD1, PD2, PD4, PD5, PD7) of the 8-bit parallel data PD0-PD7 are output as substantive parallel data and the remaining 2-bit parallel data (PD3, PD6) are converted into predetermined 2-bit data corresponding to processing at a subsequent circuit, to be output.

The display control circuit 130 generates segment signal to be applied to the segment electrode of the LCD panel 150 and common signal to be applied to the common electrode of the LCD panel 150 based on the 8-bit parallel data PD0-PD7 output from the serial-to-parallel converter circuit 120.

Figure 6:
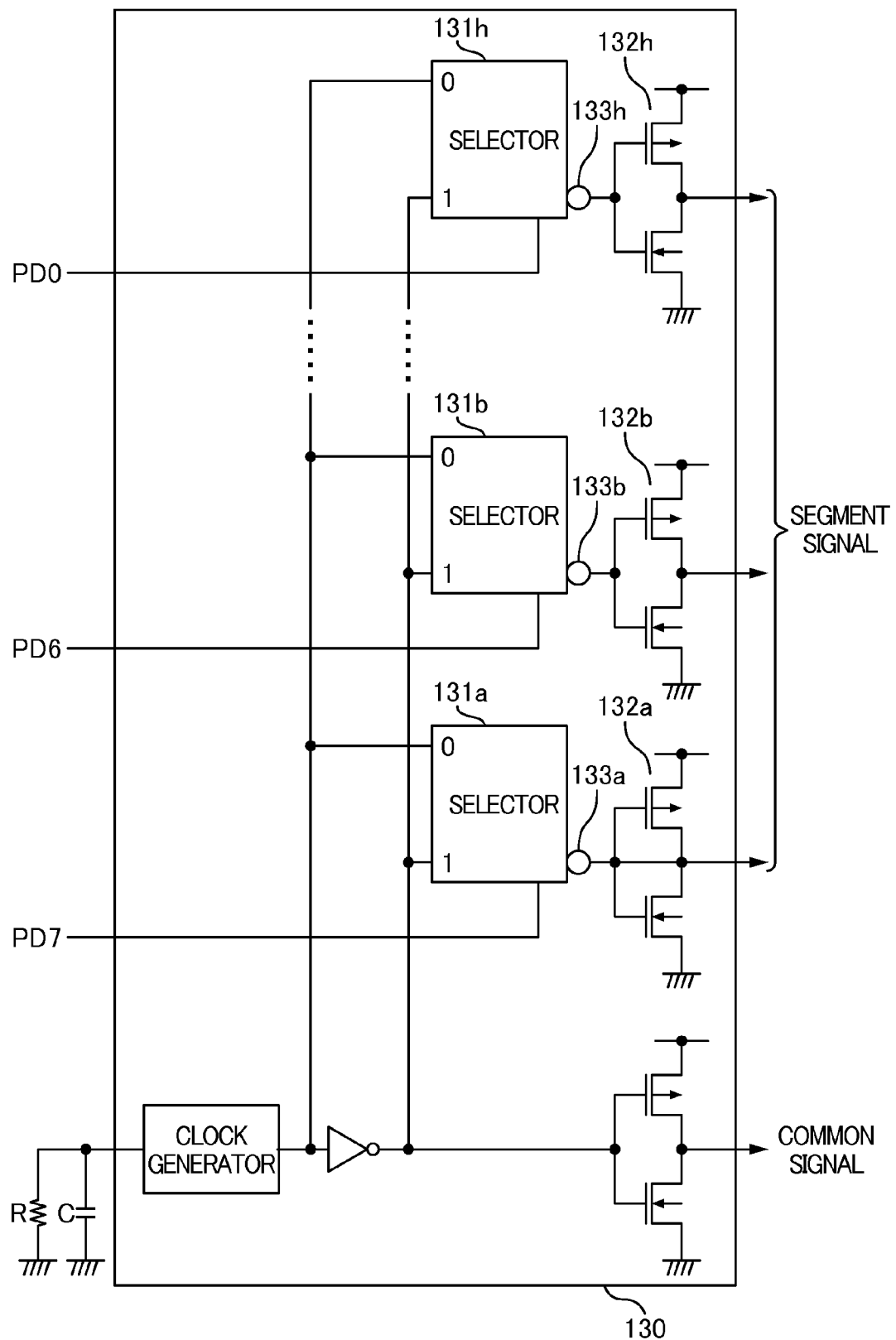
FIG. 6 is a diagram showing a configuration of a display control circuit according to an embodiment of the present invention.

The structure of the display control circuit 130 will be described with reference to FIG. 6. The 8-bit parallel data PD7-PD0 output from the serial-to-parallel converter circuit 120 are input to selector terminals of selectors 131a-131h. On the basis of the value of the 8-bit parallel data PD0 held in the latch unit 123h, the selector 131h outputs a signal input to a 0-terminal thereof when the 8-bit parallel data PD0 is at "L" indicating that the light-out status of the segment electrode is set, and outputs a signal input to a 1-terminal thereof when the 8-bit parallel data PD0 is at "H" indicating that the light-up status of the segment electrode is set. The output stage of each selector 131a-131h is provided with an inverter 133a-133h that inverts data selected among the data input to the 0-terminal and data input to the 1-terminal, and that outputs the inverted data. The inverter 132h receives the signal output from the inverter 133h and inverts again the received signal, and can output a segment signal having a waveform corresponding to a common signal.

Figure 7:
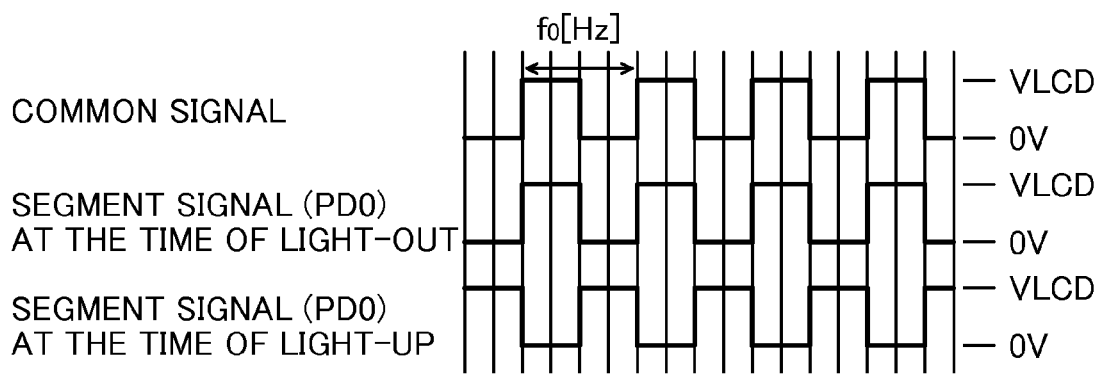
FIG. 7 is a waveform showing common signal and segment signal according to an embodiment of the present invention.

FIG. 7 shows a common signal and shows a segment signal at the time of light-up and light-out having a waveform corresponding to the common signal. The liquid crystal elements allow a backlight to pass therethrough resulting in the light-up status when the common signal and the segment signal are 180° out of phase with each other, and do not allow backlight to pass therethrough resulting in the light-out status when the common signal and the segment signal are in phase with each other. It is well-known technique to change the voltage periodically based on the characteristics of the liquid crystal as shown in FIG. 7.

The LCD panel 150 is a liquid crystal panel of TN (Twisted Nematic display) system of simple matrix or STN (Super-Twisted Nematic display), in which the segment electrode and the common electrode are disposed so as to intersect with each other. The intersecting portion of the segment electrode and the common electrode has one pixel (liquid crystal cell) and a plurality of pixels are disposed on the LCD panel 150 in the form of a lattice. In the case of the LCD module 100, an LCD panel of TFT (Thin-Film Transistor) system of active matrix may be employed instead of the LCD panel 150 of TN or STN system shown in FIG. 1. An LCD panel of TFT system is configured such that a plurality of pixels (liquid crystal cells), in each of which a thin film transistor TFT and a capacitor are connected, are disposed in the form of a lattice.

<<<Configuration of Serial-to-Parallel Converter Circuit>>>

The configuration of the serial-to-parallel converter circuit 120 will hereinafter be described using FIG. 1 with reference to FIG. 4 and FIG. 5.

The serial-to-parallel converter circuit 120 includes a serial data holding unit 121, a parallel data generating unit 122, a parallel data holding unit 123, an input mode identifying flag generating unit 124, an OR element 125, an edge detecting unit 126, and an AND element 127.

The serial data holding unit 121 holds 6-bit serial data D0-D5 or 8-bit serial data D0-D7 based on the serial data SDI and the serial clock SCL to be input from the serial interface circuit 110. The serial data holding unit 121 is configured as an 8-bit shift transistor obtained by cascade-connecting 8 D flip-flops 121a-121h. For example, the D flip-flop 121a at the first stage includes: a data input (D) thereof being input with the serial data SDI, and a clock input (C) thereof being input with the serial clock SCL. Then, a data output is input to a data input (D) of the D flip-flop 121b at the next stage. The following D flip-flops 121b-121h, are configured in a similar manner.

That is, at each rising edge of the serial clock SCL, the serial data SDI are shifted successively from the D flip-flop 121a at the first stage towards the flip flops 121b-121h at the subsequent stages. Each of data outputs SD7 (data output of the D flip-flop 121a at the first stage)-SD0 (data output of the D flip-flop 121h at the final stage) of the 8 D flip-flops 121a-121h is input to the parallel data generating unit 122.

The input mode identifying flag generating unit 124 generates, at the serial data holding unit 121, 6-bit mode identifying flag FL6 indicating that a hold of the 6-bit serial data D0-D5 is identified, or 8-bit mode identifying flag FL8 indicating that a hold of the 8-bit serial data D0-D7 is identified.

Figure 4:
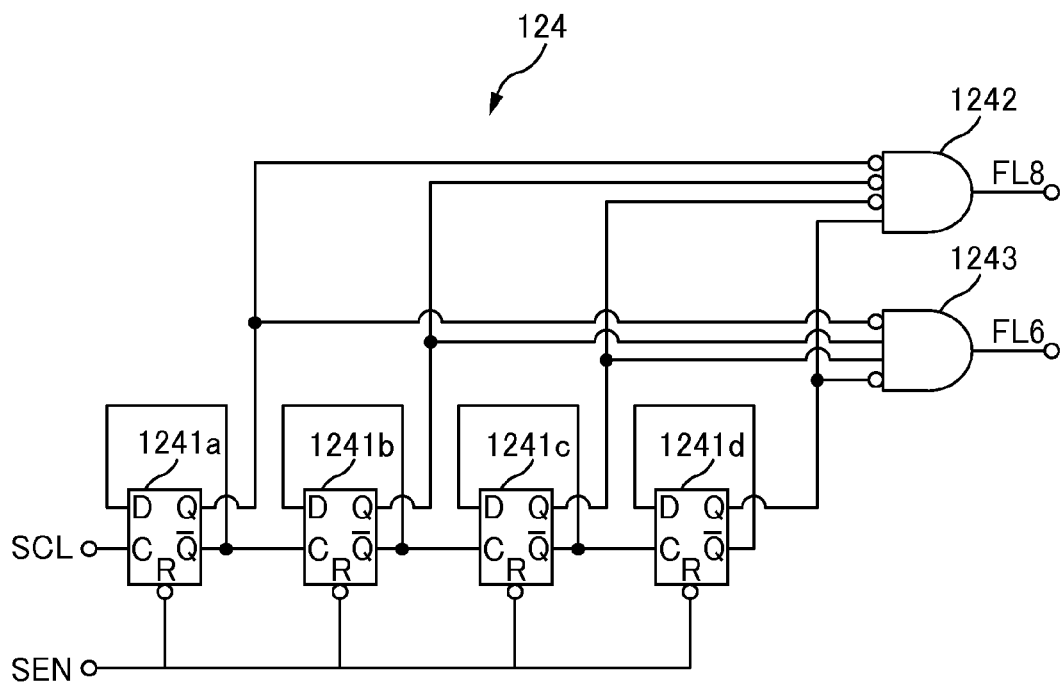
FIG. 4 is a diagram showing a configuration of an input mode identifying flag generating unit according to an embodiment of the present invention.
Figure 5:
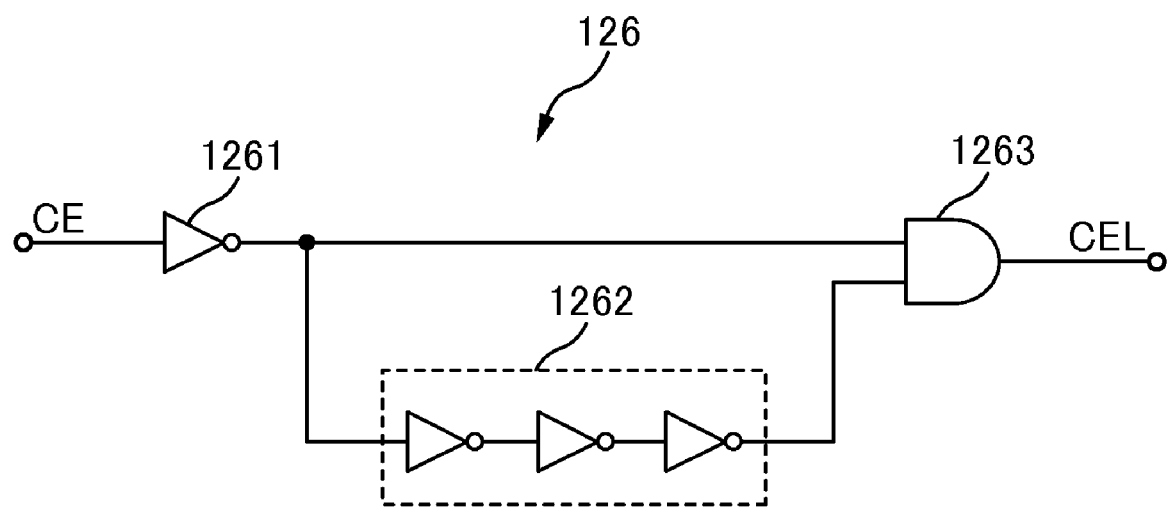
FIG. 5 is a diagram showing a configuration of an edge detecting unit according to an embodiment of the present invention.

To be more specific, as shown in FIG. 4, the input mode identifying flag generating unit 124 is configured with 4-bit counter made up of four D flip-flops 1241a-1241d, a 4-input AND element 1242 for outputting the 8-bit mode identifying flag FL8, and a 4-input AND element 1243 for outputting the 6-bit mode identifying flag FL6. At the time of the rising of the data SEN (at the time of the rising of the chip enable CE), reset of the four D flip-flops 1241a-1241d are released. Then, in a period during which the data SEN is "H" (i.e. the chip enable CE is "H"), 4-bit count starts based on the rising edge of the serial clock SCL to be input from the serial interface circuit 110.

When six cycles of the serial clock SCL in synchronization with the 6-bit serial data D0-D5 are included in a period during which the chip enable CE is "H", since respective outputs of the D flip-flops 1241a-1241d become "L", "H", "H", and "L" in the end, the 4-input AND element 1243 outputs the 6-bit mode identifying flag FL6 of "H".

On the other hand, when eight cycles of the serial clock SCL in synchronization with the 8-bit serial data D0-D7 are included in a period during which the chip enable CE is "H", since respective outputs of the D flip-flops 1241a-1241d become "L", "L", "L", and "H" in the end, the 4-input AND element 1242 outputs the 8-bit mode identifying flag FL8 of "H". At the sixth cycle of the serial clock SCL the 4-input AND element 1243 temporally outputs the 6-bit mode identifying flag FL 6 of "H".

In the case of the 8-bit input mode, the parallel data generating unit 122 outputs the serial data SD7-SD0 output from the serial data holding unit 121 to the parallel data holding unit 123 as parallel data PD7-PD0 (first parallel data) without changing an arrangement of the serial data SD7-SD0.

On the other hand, in the case of the 6-bit input mode, 2-bit serial data SD1 and SD0 of the serial data SD7-SD0 output from the serial data holding unit 121 are meaningless data. Therefore, the parallel data generating unit 122 outputs to the parallel data holding unit 123: a predetermined 2-bit data corresponding to processing of circuits at subsequent stages ("H" and "L" according to an embodiment of the present invention) instead of the 2-bit serial data SD1 and SD0; and the 6-bit serial data SD7-SD2, as 8-bit parallel data PD7-PD0 (second parallel data).

To be more specific, the parallel data generating unit 122 includes selector units 122a-122g, where one of two inputs is selected to be output according to the 6-bit input mode identifying flag FL6. Serial data SD6 and "H (=VCC)" by pull-up resistance Ra are input to the selector unit 122a, serial data SD5 or SD6 is input to the selector unit 122b, serial data SD4 or SD5 is input to the selector unit 122c, serial data SD3 or "L" by pull-down resistance Rb (=GND) is input to the selector unit 122d, serial data SD2 or SD4 is input to the selector unit 122e, serial data SD1 or SD3 is input to the selector unit 122f, and serial data SD0 or SD2 is input to the selector unit 122g. As to serial data SD7, there is no corresponding selector unit.

In such a configuration, when the 6-bit input identifying flag FL6 is "L", the selector unit 122a outputs the serial data SD6 (parallel data PD6), the selector unit 122b outputs the serial data SD5 (parallel data PD5), the selector unit 122c outputs the serial data SD4 (parallel data PD4), the selector unit 122d outputs the serial data SD3 (parallel data PD3), the selector unit 122e outputs the serial data SD2 (parallel data PD2), the selector unit 122f outputs the serial data SD1 (parallel data PD1), and the selector unit 122g outputs the serial data SD0 (parallel data PD0). The serial data SD7 is output as parallel data PD7 as it is.

On the other hand, when the 6-bit input identifying flag FL6 is "H", the selector unit 122a outputs "H" by pull-up resistance Ra (parallel data PD6), the selector unit 122b outputs the serial data SD6 (parallel data PD5), the selector unit 122c outputs the serial data SD5 (parallel data PD4), the selector unit 122d outputs "L" by pull-down resistance Rb (parallel data PD3), the selector unit 122e outputs the serial data SD4 (parallel data PD2), the selector unit 122f outputs the serial data SD3 (parallel data PD1), and the selector unit 122g outputs the serial data SD2 (parallel data PD0). The serial data SD7 is output as parallel data PD7 as it is.

As described above, the parallel data generating unit 122, in the 6-bit input mode, outputs the serial data SD7-SD0 output from the serial data holding unit 121 after an arrangement thereof have been changed, because an arrangement of the parallel data PD7-PD0 and the processing of a circuit in a subsequent stage are determined based on the 8-bit input mode having more input bits. In the 6-bit input mode, the parallel data of two bits (parallel data PD6 and PD3 according to an embodiment of the present invention) are fixed to be "H" or "L" by pull-up resistance Ra or pull-down resistance Rb.

The OR element 125 calculates a logical sum of the 6-bit input mode identifying flag FL6 and the 8-bit input mode identifying flag FL8 output from the input mode identifying flag generating unit 124. That is, the OR element 125 outputs "H" when either the 6-bit input mode identifying flag FL6 or the 8-bit input mode identifying flag FL8 is "H".

The edge detecting unit 126 detects the falling edge of the chip enable CE and outputs an edge detection signal CEL for indicating this. To be more specific, as shown in FIG. 5, the edge detecting unit 126 includes an inverter element 1261, a delay unit 1262 with an odd-number of inverter elements being connected in serial, and an AND element 1263. In such a configuration, the edge detecting unit 126 outputs the edge detection signal CEL of "H" at the falling edge of the chip enable CE and keep outputting "H" just during delay time of the delay unit 1262.

The AND element 127 calculates a logical multiplication of the OR element 125 and the edge detection signal CEL, and outputs latch enable EN. That is, when either the 6-bit input mode identifying flag FL6 or the 8-bit input mode identifying flag FL8 is "H" and the edge detection signal CEL is "H" (i.e. at the detection of the falling edge of the chip enable CE), the AND element 127 outputs the latch enable EN of "H".

The parallel data holding unit 123 takes in the 8-bit parallel data PD7-PD0 output from the parallel data generating unit 122 at the timing at which the latch enable EN changes from "H" to "L", to be output to the display control circuit 130. To be more specific, the parallel data holding unit 123 includes latch units 123a-123h corresponding to the 8-bit parallel data PD7-PD0 respectively.

<<<Operation of Serial-to-Parallel Converter Circuit>>>
—In the Case of 8-Bit Input Mode—

FIG. 8 is a waveform diagram of a main signal illustrating an operation of the serial-to-parallel converter circuit 120 in the case of the 8-bit input mode.

First, the microcomputer 200 transfers to the LCD module 100 the chip enable CE of "L", the serial clock CL and 8-bit address codes A0-A7 (serial data DI) in synchronization with the serial clock CL. At this time, the serial interface circuit 110 detects that the address codes A0-A7 transferred from the microcomputer 200 coincides with address codes of the LCD module 100. However, since the chip enable CE is "L", the serial clock SCL and the serial data SDI to be output to the serial-to-parallel converter circuit 120 remain in a state of "L". In other words, the serial-to-parallel converter circuit 120 does not perform a serial-to-parallel conversion operation.

Next, after completing transfer of the address codes A0-A7, the microcomputer 200 transfers to the LCD module 100 the chip enable CE of "H", the serial clock CL and the 8-bit serial data D0-D7 (serial data DI) in synchronization with the serial clock CL. Eight cycles of the serial clock CL are included in a period during which the chip enable CE is "H" (the number of generation of the rising edge is eight). Since the serial interface circuit 110 has already detected that the chip enable CE is "H" and the address codes A0-A7 coincide with address codes of the LCD module 100, the serial interface circuit 110 outputs to the serial-to-parallel converter circuit 120 the serial data D0-D7 (serial data SDI) in synchronization with the serial clock SCL corresponding to the serial clock CL.

The serial-to-parallel converter circuit 120 holds in sequence the serial data D0-D7 output from the serial interface circuit 110 at the timing of the rising edge of the serial clock SCL in the D flip-flops 121a-121h of the serial data holding unit 121. Since the 6-bit input mode identifying flag FL6 and the 8-bit input mode identifying flag FL8 are "L" during a period between the first serial clock SCL and the fifth serial clock SCL, the parallel data generating unit 122 outputs to the parallel data holding unit 123 respective data outputs SD7-SD0 of the D flip-flops 121a-121h of the serial data holding unit 121 as they are. For example, at the time of the fifth serial clock SCL, the serial data D4 (SD7)-D0 (SD3) held in the D flip-flops 121a-121e of the serial data holding unit 121 are output as parallel data PD7-PD3. However, since the latch enable EN is "L", the parallel data PD7-PD0 are not held in the parallel data holding unit 123.

When the serial clock SCL is at the sixth cycle, since the 6-bit input mode identifying flag FL6 becomes temporally "H", the parallel data generating unit 122 does not use SD1 and SD0 which are invalid data in the 6-bit input mode, but uses "H" by pull-up resistance Ra and "L" by pull-down resistance Rb. At this point, data handled by the parallel data generating unit 122 are {D5, D4, D3, D2, D1, D0} and {1 (=H), 0 (=L)}. As shown in FIG. 8, the parallel data PD7-PD0 are converted in arrangement into {D5, 1 (=H), D4, D3, 0 (=L), D2, D1, D0}. However, since the latch enable EN is "L", the parallel data PD7-PD0 are not held in the parallel data holding unit 123.

At the time of the seventh serial clock SCL, since the 6-bit input mode identifying flag FL6 becomes "L" again, the above conversion in arrangement, etc. are not performed by the parallel data generating unit 122. Therefore, the serial data D6 (SD7)-D0 (SD1) held in the D flip-flops 121a-121g of the serial data holding unit 121 are output as parallel data PD7-

PD1. However, since the latch enable EN is "L", the parallel data PD7-PD0 are not held in the parallel data holding unit 123.

When the serial clock SCL is at the eighth cycle, since the 6-bit input mode identifying flag FL6 also becomes "L", the above conversion in arrangement, etc. are not performed by the parallel data generating unit 122. Therefore, the serial data D7 (SD7)-D0 (SD0) held in the D flip-flops 121a-121h of the serial data holding unit 121 are output as parallel data PD7-PD0. The 8-bit input mode identifying flag FL8 becomes "H" and the chip enable CE changes from "H" to "L". Accordingly, since the latch enable EN becomes "H", the parallel data PD7-PD0 are held in the parallel data holding unit 123.

—In the Case of 6-Bit Input Mode—

FIG. 9 is a waveform diagram of a main signal illustrating an operation of the serial-to-parallel converter circuit 120 in the case of the 6-bit input mode.

The difference between the 8-bit input mode shown in FIG. 8 and this case is that six cycles of the serial clock SCL will be generated when the chip enable CE is "H". Therefore, in the case of the 6-bit input mode, the 8-bit input mode identifying flag FL8 never becomes "H".

When the serial clock SCL is at the sixth cycle, since the 6-bit input mode identifying flag FL6 becomes "H", the parallel data generating unit 122 does not use SD1 and SD0 which are invalid data in the 6-bit input mode, but uses "H" by pull-up resistance Ra and "L" by pull-down resistance Rb. For example, "H" by pull-up resistance Ra is used for control with necessity of a constant ON state in the 6-bit input mode. "L" by pull-down resistance Rb is used for unassigned terminal in the 6-bit input mode. At this point, data handled by the parallel data generating unit 122 are {D5, D4, D3, D2, D1, D0} and {1 (=H), 0 (=L)}. As shown in FIG. 9, the parallel data PD7-PD0 are converted in arrangement into {D5, 1 (=H), D4, D3, 0 (=L), D2, D1, D0}. Then, the 6-bit input mode identifying flag FL6 becomes "H" and the chip enable CE changes from "H" to "L". Accordingly, since the latch enable EN becomes "H", the parallel data PD7-PD0 are held in the parallel data holding unit 123.

As described above, according to an embodiment of the present invention, it is possible to achieve a serial-to-parallel converter circuit as a device at receiving side (for example, LCD module) capable of supporting both an m-bit input mode and an n-bit input mode. A device at transmitting side such as a microcomputer does not need to be provided with an input terminal for mode control signal for determining whether the m-bit input mode or the n-bit input mode. It is sufficient that a serial transfer format of either the m-bit input mode or the n-bit input mode is set for a control register etc. originally included in a CPU of the device at transmitting side, and therefore there is no need for improvement of not only software but also hardware at the time of replacement of existing devices. That is, it is possible to provide a serial-to-parallel converter circuit of a device at a receiving side capable of supporting both the m-bit input mode and the n-bit input mode while maintaining compatibility with a device at transmitting side. And therefore, it is possible to achieve reduced designing time and reduced cost for design of a system made up of a device at transmitting side and a device at receiving side.

Other Embodiments

The above embodiments of the present invention are simply for facilitating the understanding of the present invention and are not in any way to be construed as limiting the present invention. The present invention may variously be changed or altered without departing from its spirit and encompass equivalents thereof.

The serial data to be transferred from the microcomputer 200 to the LCD module 100 may be not only display data of the LCD panel 150 but also component signals of a luminance signal (Y) and a color-difference signal (Cr, Cb) or a composite signal obtained by combining the above signals. Data transfer system between the microcomputer 200 and the LCD module 100 may be not only a three-wire serial interface but also a four-wire serial interface or a two-wire serial interface.

A four-wire serial interface: uses four buses of serial input data SI as serial data DI, serial output data SO, the serial clock CL and the chip enable CE; and is identical to a three-wire serial interface except that serial output data SO is added. In other words, serial input data SI, the serial clock CL and the chip enable CE are transferred according to the same serial transfer format of the serial data DI, the serial clock CL and the chip enable CE shown in FIGS. 8 and 9.

A two-wire serial interface, which is applicable to, for example, an I2C bus, uses only two buses of serial data SDA and the serial clock SCL. Before and after the serial data of which the number of input bits are set to be 8-bit or 6-bit, there are added a start bit (a bit of SDA when SCL is "H" and SDA is changed from "H" to "L") and a stop bit (a bit of SDA when SCL is "H" and SDA is changed from "L" into "H"). The transfer of the serial data begins by a start bit and is completed by a stop bit.

It is possible to apply all the configurations disclosed in Japanese Patent Laid-Open Patent Publication No. 2005-94694 to the serial interface circuit 110. For instance, it is possible to employ the configuration shown in FIGS. 1 and 2 of this patent publication wherein no identification by address codes is performed. In this case, the address register 111 and the address decoder 112 are not needed. In the case of employing a two-wire or a four-wire serial interface, the serial interface circuit 110 needs to be replaced depending on the buses thereof.

There are here 8 (m) bits or 6 (n) bits in number as to input bits of the serial data to be transferred from the microcomputer 200 to the LCD module 100. However, it should not be construed restrictively. For example, the serial data of 10-bits or the serial data of 13-bits may be used.

That is, whatever routes is taken from the microcomputer 200 to the serial-to-parallel converter circuit 120, it is essential only that the serial data SDI and the serial clock SCL to be in synchronization with the serial data SDI are input to the serial-to-parallel converter circuit 120 as is the case of the serial transfer format after transfer of the address codes A0-A7 shown in FIG. 8 and FIG. 9.

Predetermined 2-bit (=8 bits–16 bits) data instead of the serial data SD1, SD2 in the 6-bit input mode are here "H" by pull-up resistance Ra and "L" by pull-down resistance Rb. However, it should not be construed restrictively. Similarly, the conversion in arrangement is performed in the 6-bit input mode, that is, the parallel data PD7-PD0 output from the parallel data generating unit 122 are converted from {D5, D4, D3, D2, D1, D0} and {1 (=H), 0 (=L)} instead of SD1 and SD0 into {D5, 1 (=H), D4, D3, 0 (=L), D2, D1, D0}. However, it should not be construed restrictively. Various conversions in arrangement are performed depending on disposition of 2-bit data to be used instead of the above-mentioned predetermined data in the 6-bit input mode, of the parallel data PD7-PD0 output from the parallel data generating unit 122.

Input modes from which a selection is made are not limited to two input modes that is the 6-bit input mode and the 8-bit input mode. It is possible to select among more than three input modes, if changes are made such that the input mode identifying flag generating unit 124 generates the input mode identifying flag corresponding to the number of input modes and the parallel data generating unit 122 generates the parallel data corresponding to the number of input modes.

It is claimed:

1. A serial-to-parallel converter circuit for converting serial data into parallel data to be output, comprising:
    an m-bit serial data holding unit configured to be input with serial data and a serial clock synchronized with the serial data, an input bit number of the serial data being set to be m bits or n bits smaller than the m bits within a transfer period from transfer start to transfer completion, and configured to shift and hold the serial data by one bit based on the serial clock;
    an input mode identifying unit configured to identify whether the input bit number is m bits or n bits, based on an count value obtained by counting the number of generation of the serial clock during the transfer period; and
    a parallel data generating unit configured to output m-bit data held in the m-bit serial data holding unit as first parallel data when the input mode identifying unit identifies the input bit number to be m bits, and configured to output m-bit data obtained by adding predetermined (m−n)-bit data to n-bit data held in the m-bit serial data holding unit as second parallel data when the input mode identifying unit identifies the input bit number to be n bits.

2. The serial-to-parallel converter circuit according to claim 1, wherein
    the parallel data generating unit
    performs a conversion in arrangement for m-bit data obtained by adding predetermined (m−n)-bit data to n-bit data held in the serial data holding unit, corresponding to a circuit at a subsequent stage, and
    outputs the m-bit data converted in arrangement as the second parallel data,
    when the input mode identifying unit identifies the input bit number to be n bits.

3. The serial-to-parallel converter circuit according to claim 1, further comprising:
    a transfer completion identifying unit configured to identify the transfer completion; and
    a parallel data holding unit configured to hold and output the first parallel data or the second parallel data, based on: an output of the input mode identifying unit when identifying the input bit number to be m bits or n bits; and an output of the transfer completion identifying unit when identifying the transfer completion.

4. The serial-to-parallel converter circuit according to claim 1, wherein:
    a three-wire serial interface of the serial data, the serial clock, and a chip enable is used;
    transfer starts when the chip enable changes from one level to the other level;
    transfer completes when the chip enable changes from the other level to the one level; and
    the serial data is input in synchronization with the serial clock, the input bit number of the serial data being set to be m bits or n bits within the transfer period in which the chip enable changes to the other level.

5. The serial-to-parallel converter circuit according to claim 1, wherein:
    a four-wire serial interface of serial input data and serial output data as the serial data, the serial clock, and a chip enable is used;
    transfer starts when the chip enable changes from one level to the other level;
    transfer completes when the chip enable changes from the other level to the one level; and
    the serial data is input in synchronization with the serial clock, the input bit number of the serial data being set to be m bits or n bits within the transfer period in which the chip enable changes to the other level.

6. The serial-to-parallel converter circuit according to claim 4, wherein:
    the chip enable is set to the one level and an address code is transferred as the serial data in synchronization with the serial clock, and thereafter the chip enable is changed from the one level to the other level and the serial data is transferred, the input bit number of the serial data being set to be m bits or n bits; and
    a serial interface circuit is provided at a previous stage, the serial interface circuit being configured to input to the serial-to-parallel converter circuit the serial clock and the serial data transferred when the chip enable is at the other level, when the address code transferred when the chip enable is at the one level coincides with an address code given to the serial-to-parallel converter circuit.

7. The serial-to-parallel converter circuit according to claim 1, wherein:
    a two-wire serial interface of the serial data and the serial clock is used;
    a start bit and a stop bit are added before and after the serial data whose input bit number is set to be m bits or n bits;
    the transfer start is performed by the start bit; and
    the transfer completion is performed by the stop bit.

8. A liquid crystal display driving circuit for driving a liquid display panel, comprising:
    an m-bit serial data holding unit configured to be input with serial data as display data of the liquid crystal display panel and a serial clock synchronized with the serial data, an input bit number of the serial data being set to be m bits or n bits smaller than the m bits within a transfer period from transfer start to transfer completion, and configured to shift and hold the serial data by one bit based on the serial clock;
    an input mode identifying unit configured to identify whether the input bit number is m bits or n bits, based on an count value obtained by counting the number of generation of the serial clock during the transfer period; and
    a parallel data generating unit configured to output m-bit data held in the m-bit serial data holding unit as first parallel data when the input mode identifying unit identifies the input bit number to be m bits, and configured to output m-bit data obtained by adding predetermined (m−n)-bit data to n-bit data held in the m-bit serial data holding unit as second parallel data when the input mode identifying unit identifies the number of input bits to be n bits.

* * * * *